United States Patent
Bettner et al.

(10) Patent No.: US 7,279,989 B2
(45) Date of Patent: Oct. 9, 2007

(54) APPARATUS, SYSTEM AND METHOD CAPABLE OF CLOCK NOISE MITIGATION USING A FREQUENCY ADAPTIVE PROCESS

(75) Inventors: Al Bettner, Los Gatos, CA (US); Xintian Eddie Lin, Mountain View, CA (US); Kevin P. Slattery, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/169,365

(22) Filed: Jun. 28, 2005

(65) Prior Publication Data

US 2006/0290434 A1  Dec. 28, 2006

(51) Int. Cl.
*H03L 7/18* (2006.01)
*H04B 1/10* (2006.01)

(52) U.S. Cl. .................... 331/16; 455/260; 455/296

(58) Field of Classification Search ........... 331/1 A, 331/16, 18, 25; 327/156–159; 332/127; 360/51; 375/376; 455/260
See application file for complete search history.

(56) References Cited

U.S. PATENT DOCUMENTS 5,745,848 A * 4/1998 Robin .................... 455/296
5,812,590 A * 9/1998 Black et al. ............. 375/130
6,040,738 A * 3/2000 Uchida .................... 329/302
2002/0137465 A1* 9/2002 Nakano .................... 455/62

* cited by examiner

Primary Examiner—David Mis
(74) Attorney, Agent, or Firm—James S. Finn

(57) ABSTRACT

An embodiment of the present invention provides an apparatus, comprising an oscillator capable of generating a clock signal, wherein said apparatus is capable of clock noise mitigation using a frequency adaptive algorithm, technique, process or system. And wherein said oscillator may be a voltage controlled oscillator (VCO) operating near a desired frequency used to generate an output signal. The clock noise mitigation may accomplished by portion of said VCO signal being fed into a first dividing circuit capable of dividing by a given number M, and a second dividing circuit, N, wherein said first and second dividing circuits may be capable of producing a signal close to the frequency of a reference oscillator, said VCO signal may then be compared via a phase comparator to a reference frequency and wherein the phase comparator signal may then be fed back to the VCO such that its frequency will "lock" to said reference oscillator. The M and N dividers may be set to enable the frequency increments to be as small as desired and may be dynamically programmable. Depending on the communication channels being used, the frequency of the clock may modified either up or down to avoid interference.

25 Claims, 5 Drawing Sheets

APPARATUS, SYSTEM AND METHOD CAPABLE OF CLOCK NOISE MITIGATION USING A FREQUENCY ADAPTIVE PROCESS

BACKGROUND

Wireless networks and wireless communication have become prevalent throughout society creating the need for increased capacity and faster and more reliable wireless communication techniques. A difficulty in wireless communications is interference caused by high speed signals from, for example and not limited to, notebook PCs causing interference with wireless devices (such as wireless local area networks (LANs), wireless wide area networks (WWANs), or other wireless networks) embedded in a mobile platform.

Certain signals generated in a notebook computer, for example, have been found to be serious sources of RF interference. In particular, clocking signals used to transfer data to and from various portions of the PC (e.g. processor to/from memory) have been found to be primary sources of electromagnetic interference (EMI). Although clock signals themselves are relatively low in frequency (less than 150 MHz), they may have very fast rise times, causing spectral emissions at frequencies many times higher than their fundamental period. This is due to the high harmonic content found in signals having pulse-like behavior.

Thus, a strong need exists for an apparatus, system and method capable of clock noise mitigation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Figure 1:
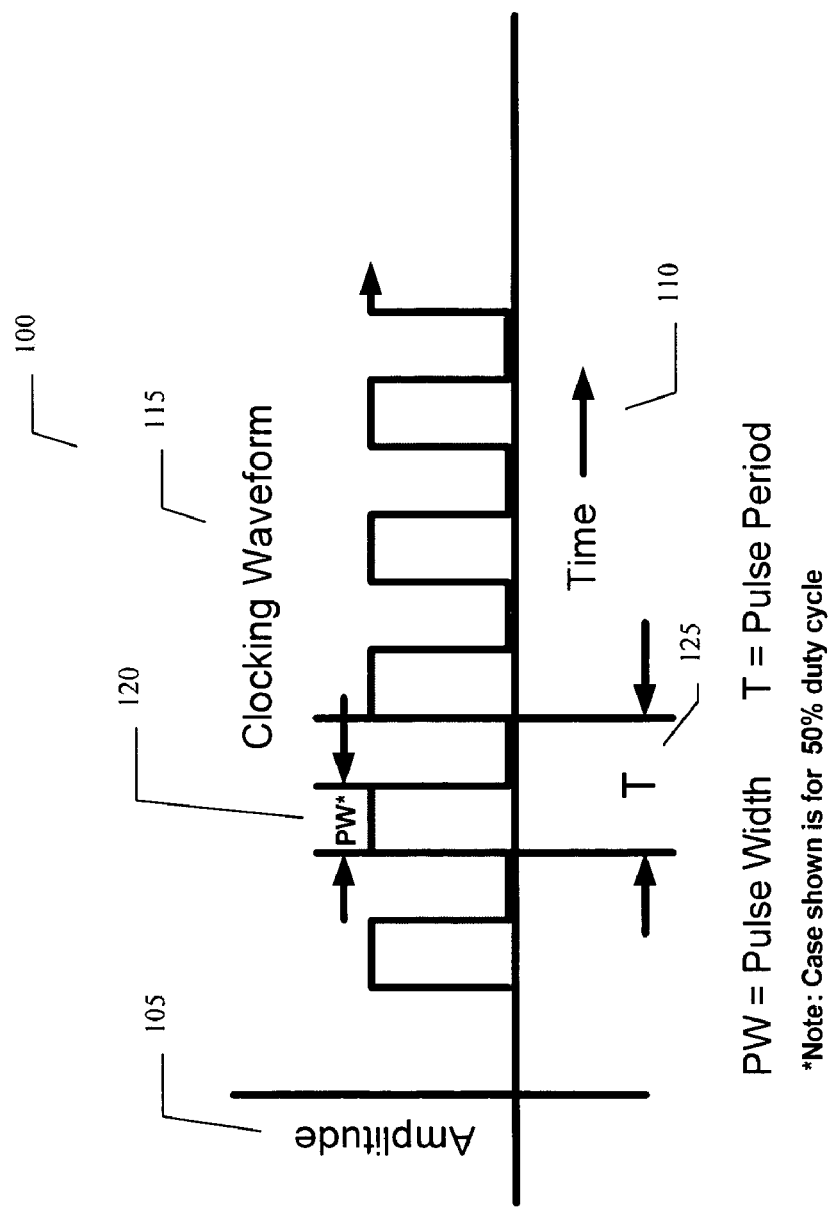
FIG. 1 illustrates a time domain waveform of clock signal of one embodiment of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EE-PROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause and effect relationship).

It should be understood that embodiments of the present invention may be used in a variety of applications. Although the present invention is not limited in this respect, the devices disclosed herein may be used in many apparatuses such as in the transmitters and receivers of a radio system. Radio systems intended to be included within the scope of the present invention include, by way of example only, cellular radiotelephone communication systems, satellite communication systems, two-way radio communication systems, one-way pagers, two-way pagers, personal communication systems (PCS), personal digital assistants (PDA's), wireless local area networks (WLAN), personal area networks (PAN, and the like).

Certain signals generated in the notebook have been found to be serious sources of RF interference. In particular, clocking signals used to transfer data to and from various portions of the PC (e.g. processor to/from memory) have been found to be primary sources of electromagnetic interference (EMI). Although clock signals themselves are relatively low in frequency (less than 150 MHz), they have very fast rise times, causing spectral emissions at frequencies many times higher than their fundamental period. This is due to the high harmonic content found in signals having pulse-like behavior. An embodiment of the present invention may restore the otherwise degraded performance of wireless devices by adaptively shifting clock harmonics away from an active channel. This will ensure that wireless device specifications for operating range and throughput will be maintained. The end user will ultimately benefit by being able to realize maximum range and throughput using integrated wireless devices.

Figure 2:
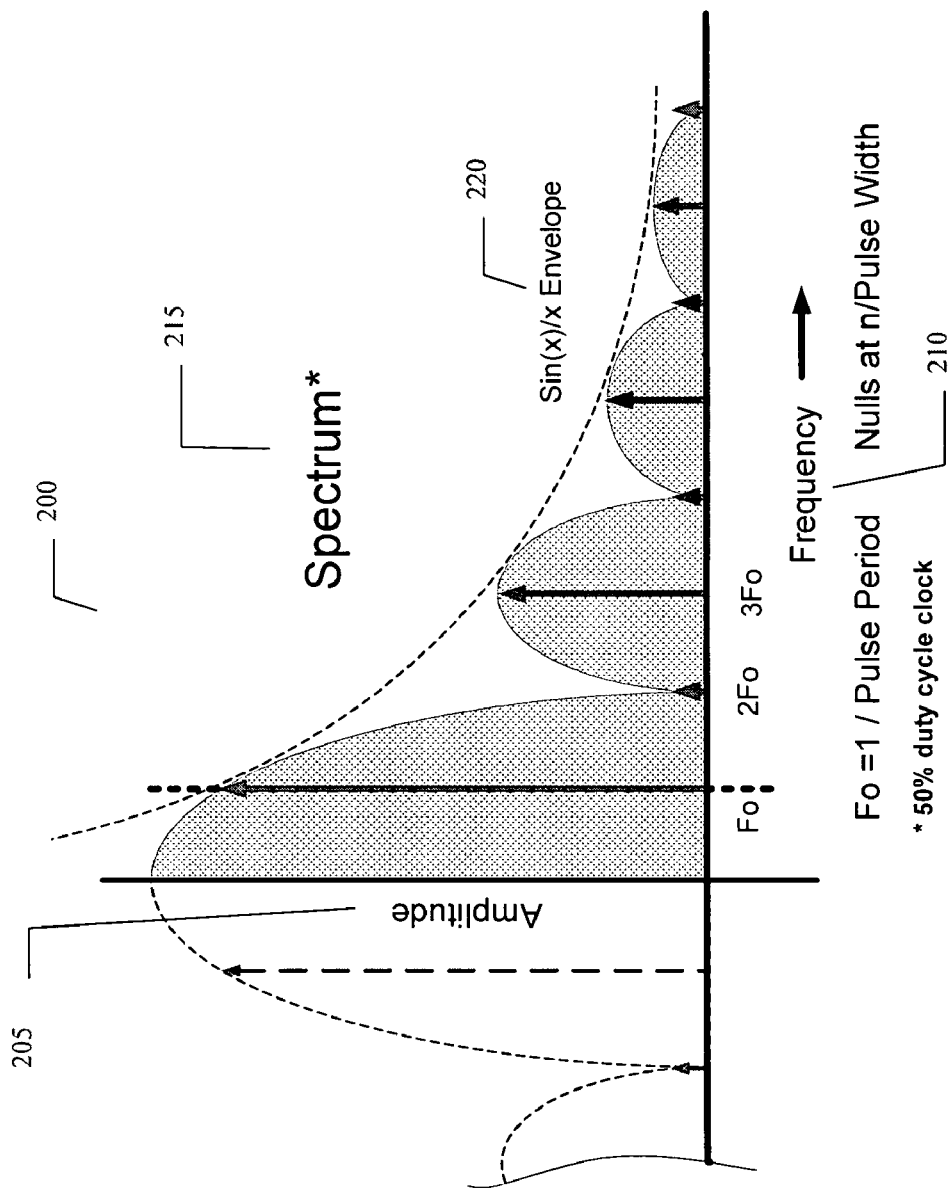
FIG. 2 illustrates the spectrum of clocking waveform of one embodiment of the present invention.

Turning now to the figures, FIGS. 1 and 2 illustrate how a clock waveform can generate harmonic energy. FIG. 1, generally at 100, illustrates a time domain waveform 115 of clock signal 120 in amplitude 105 vs. time 110 of one embodiment of the present invention. FIG. 2 illustrates, generally at 200, the spectrum 215 of clocking waveform 115 in frequency 210 vs. amplitude 205 of one embodiment of the present invention. The envelope of Sin(x)/x is shown at 220.

FIGS. 1 and 2 illustrate how a clocking waveform of relatively low frequency may produce harmonics at many times the pulse repetition frequency (PRF). In the case of the PC, a clock frequency of 100 MHz could produce harmonics at many times this frequency; although it is understood that the present invention is not limited to PCs or any particular frequencies. Since the harmonics will fall as 1/n, harmonics at many times the fundamental have the potential to interfere with co-located radios. For example:

If the fundamental frequency, fo=100 MHz; and clock voltage=3.3v; N (harmonic)=24; then V(harmonic) =0.0417v and the power (50 ohms) would be P(RF)~ $((0.0417)^2)/(2\times 50)=1.74$ E-05 watts=0.0174 mW. In dBm, the power wold be P(dBm)=10×log (0.0174)=−17.6 dBm. This is a very strong signal when compared to the levels seen at the input to a wireless receiver (often below −100dBm).

Although the inherent physical separation between this interfering signal and the receive antenna may offer some improvement (usually in the order of 30 to 40dB of isolation) this may not be nearly enough to guarantee immunity of the receiver.

Since the clock signals may be essential for the operation of the PC, there was no simple existing way to eliminate this problem. Sharp edges may be needed in order to keep buses synchronized. Although smoothing the edges on the clock will reduce harmonic content, it may result in enough jitter to cause timing problems.

In an embodiment of the present invention, rather than attempting to reduce the clock interference directly, an embodiment of the present invention addresses the problem by moving the fundamental clock frequency, hence the harmonics that fall into the radio channels. Since the harmonics of the clock frequencies are many times the fundamental, moving the clock only a small percentage may move an undesired harmonic sufficiently to avoid a radio channel. For example, for a clock signal of 100 MHz:

Assume a clock frequency of 100 MHz

Harmonic number 24 will be at 2400 MHz

For 802.11b, (it is understood that the present invention is not limited to 802.11b or any other standard or frequency) it is needed to move the harmonic at least +/−7.5 MHz to minimize any impact to the receiver (the receiver IF is 15 MHz). This implies moving the fundamental clock frequency 7.5 MHz/24=312 KHz. In terms of percentage, this shift is less than 0.5%. In many systems today, the clock is already spread (by up to 0.5%) to reduce EMI for FCC regulatory reasons. It is understood that the present invention is not limited to moving the clock frequency any given amount, but rather may be moved a predetermined amount according to design specifications.

Clock frequencies may be generated through the use of a crystal oscillator and phase locked loop. The crystal oscillator may be used to generate a stable signal source. A voltage controlled oscillator (VCO) operating near the desired frequency may be used to generate the output signal. A portion of the VCO signal may be fed into a dividing circuit that produces a signal close to the frequency of the reference oscillator. This signal may then be compared (via a phase comparator) to the reference frequency. The phase comparator signal may then be fed back to the VCO such that its frequency will "lock" to the reference oscillator.

Figure 3:
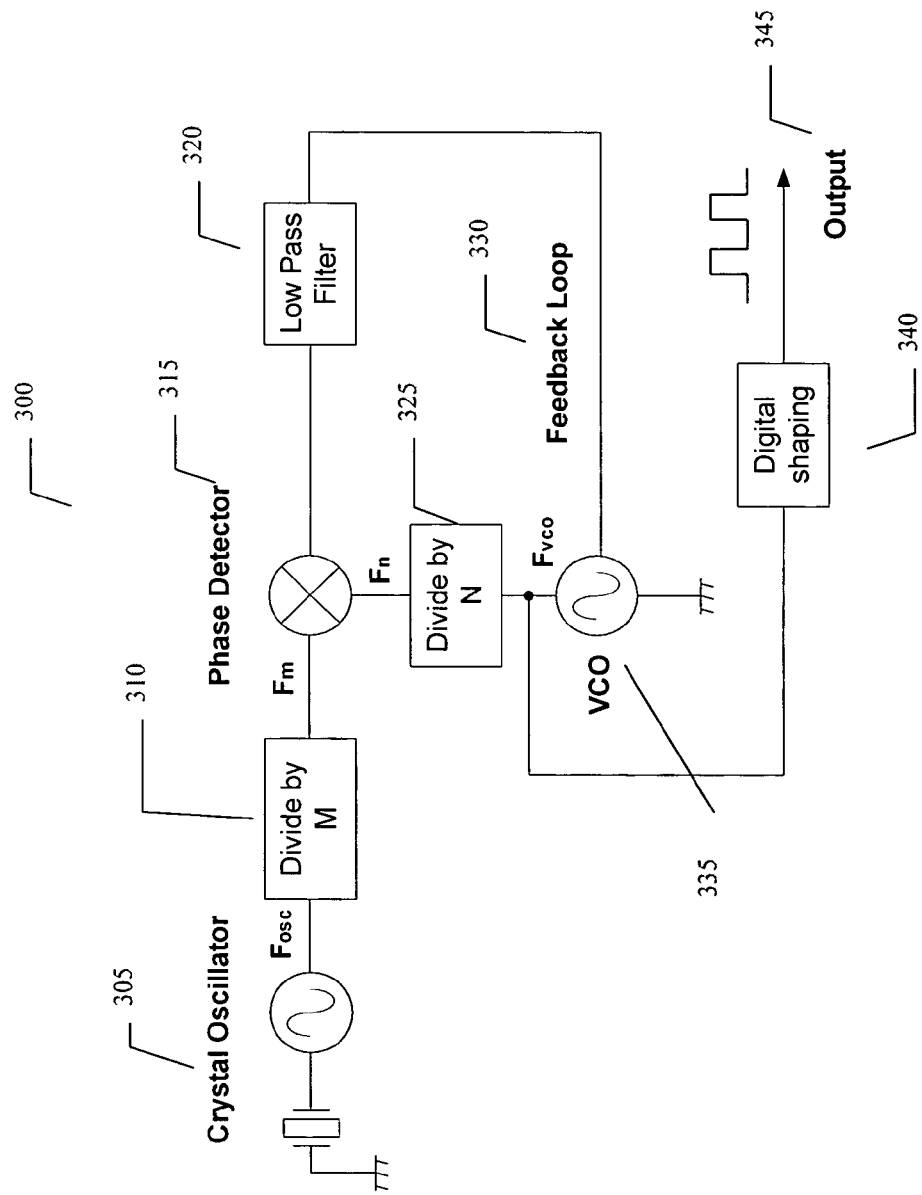
FIG. 3 illustrates a phase locked loop of one embodiment of the present invention.

This is illustrated in FIG. 3, generally at 300, which illustrates a phase locked loop (PLL) of one embodiment of the present invention. The output 345 of the PLL 300 is a high frequency sinusoidal signal, but it may easily be converted to a lower frequency clock signal using a post divider and digital shaping circuit 340. The frequency of the output signal 345 may be adjusted by varying the M and N coefficients of the dividers 310 and 325. It may be seen that if M and N are sufficiently large, the frequency increments may be as small as desired. For example, assume that the crystal oscillator 305 frequency (Fosc) is 10 MHz and that the VCO 335 frequency (Fvco) is near 1000 MHz. If M=10, then Fm=1.0 MHz; and If N=1000, Fn~1.0 MHz. When the loop is closed, the frequency of the VCO 335 will lock at 1000 MHz. Now, if N is changed to 99, the VCO 335 will drop in frequency by 1 MHz so that Fn will be 1 MHz and the loop will once again be in lock. Using a post divider of 10 will produce a clock signal of 100 MHz.

If it is assumed that the clock is at 100 MHz, and 24 harmonic of the clock is producing a harmonic at 2400 MHz (the 802.11b communications band—although the present invention is not limited to this standard or frequency), by changing the value of N from 100 to 99, the fundamental frequency of the clock will drop to 99 MHz, and the frequency of the 24th harmonic will drop by 24 MHz, to 2376 MHz. Thus, the harmonic will no longer be in the 802.11b band. It is understood that the aforementioned examples are for illustrative purposes only.

In an embodiment of the present invention, the M and N dividers 310 and 325 may be dynamically programmable. Depending on the communication channels being used, the frequency of the clock could be "nudged" either up or down to avoid interference. In order to determine if sufficient separation of the interfering signal and channel has been met, feed back loop 330 may be needed. Low pass filter 320 may be incorporated into the feedback loop 330.

Figure 4:
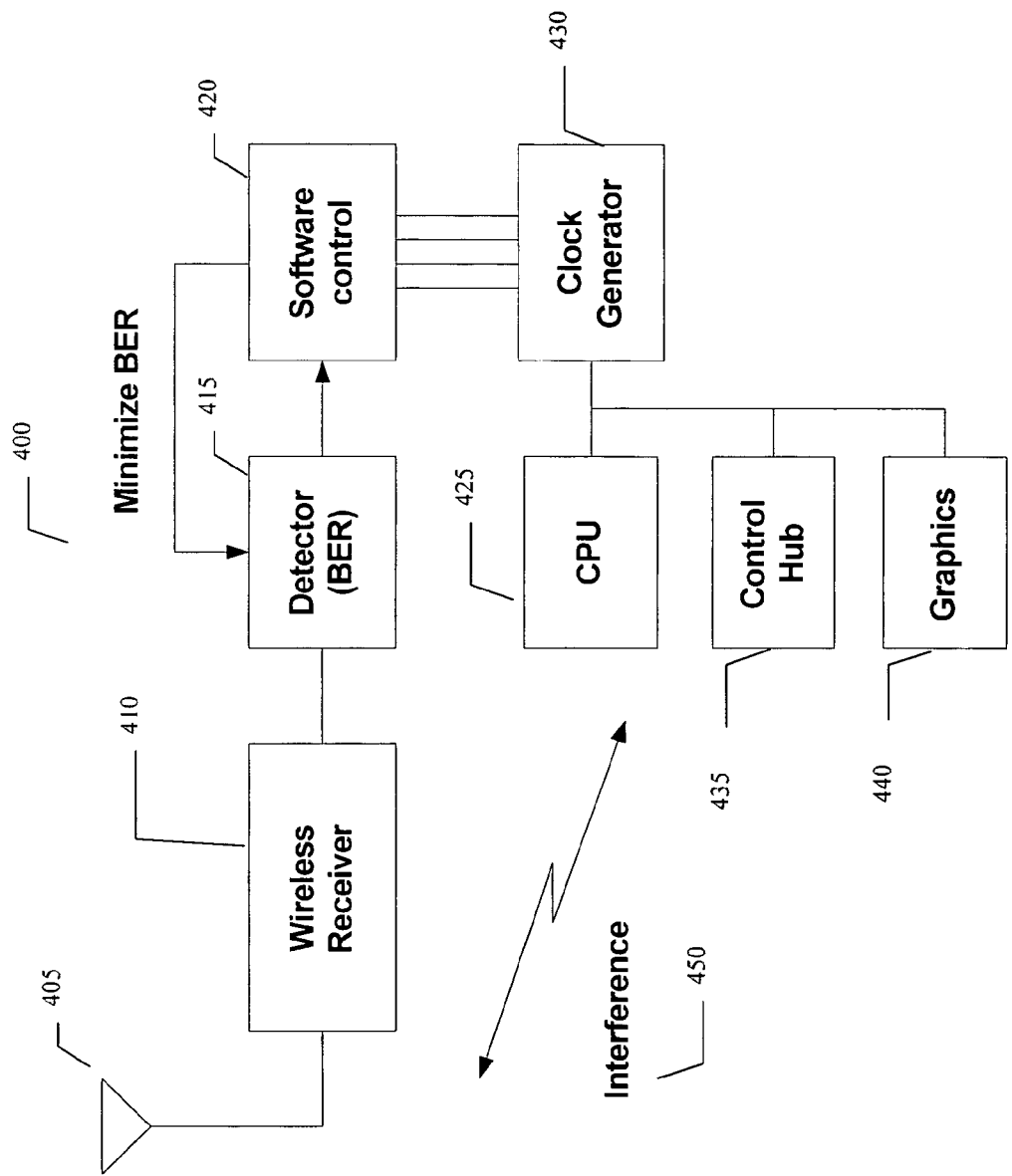
FIG. 4 illustrates a frequency adaptive clock mitigation block diagram of one embodiment of the present invention.

Turning now to FIG. 4, illustrated generally at 400, is a frequency adaptive clock mitigation block diagram of one embodiment of the present invention. As illustrated in FIG. 4, signals entering the antenna 405 of wireless receiver 410 are subjected to clock noise interference 450. Whenever the wireless receiver is activated (or changes its operating frequency), a software control 420 module queries the radio for its current channel number. Using a programmed lookup table, the software control 420 (knowing the channel number of the radio) issues instructions to the clock generator 430 to adjust its frequency so that any resultant harmonics will not fall into the active radio channel. The lookup table method is possible since the frequency of the interfering clock is known and a relationship between the harmonic of the clock and the victim radio channel is easily derived. Once this relationship has been determined, it is obvious that moving the clock frequency slightly higher (or lower) by the correct amount will avoid any potential collisions between clock harmonics and active radio channel. Clock generator 430 is associated with CPU 425, control hub 435 and graphics 440.

Figure 5:
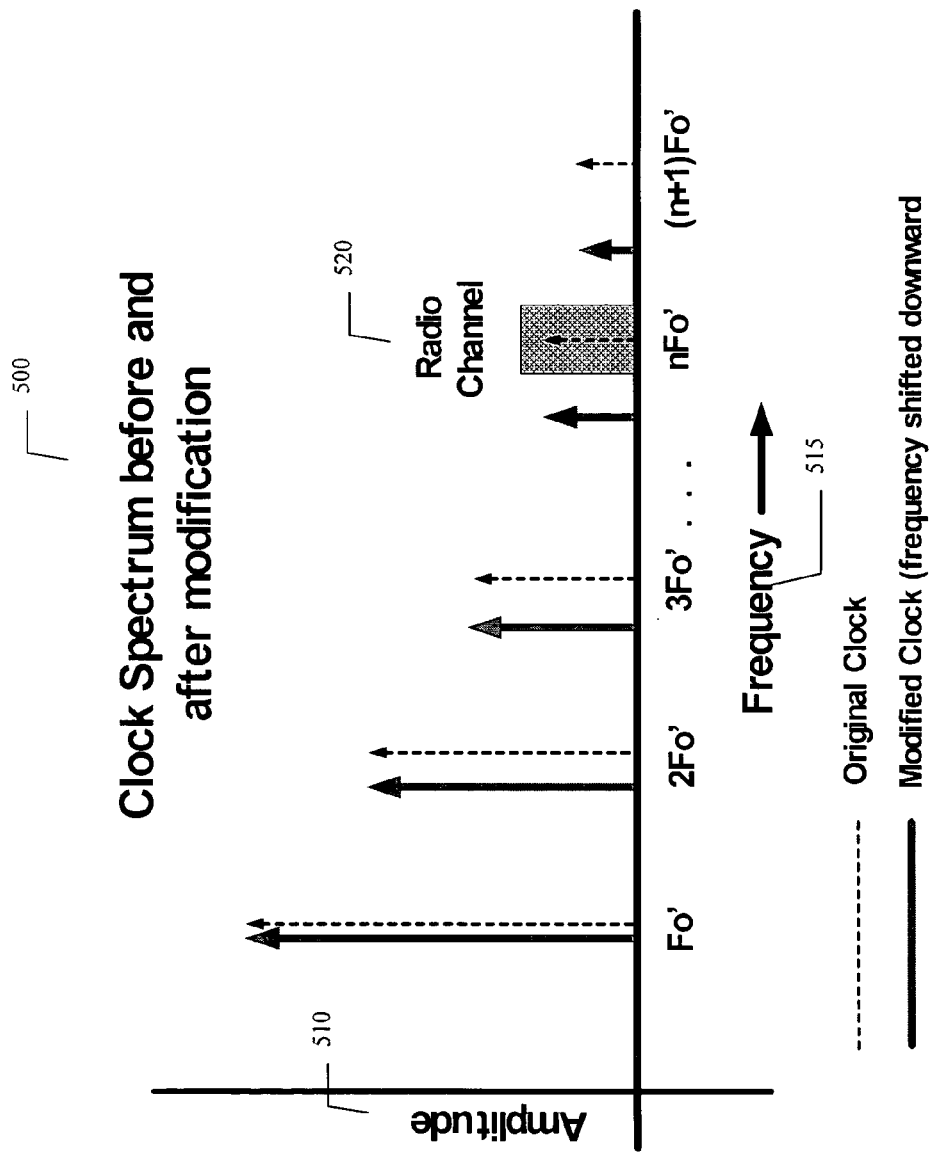
FIG. 5 illustrates channel avoidance using the frequency adaptive clock of one embodiment of the present invention It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

Turning now to FIG. 5, illustrated generally at 500, is shown, in amplitude 510 vs. frequency 515, how moving the frequency of the clock can avoid interference to the radio channel. As seen in one embodiment of the present invention in FIG. 5, by moving the fundamental frequency 520 only a small amount, the shift in frequency at harmonic n will be n times and then the clock harmonic no longer poses a threat.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. An apparatus, comprising:
an oscillator capable of generating a clock signal, wherein said apparatus is capable of clock noise mitigation using a frequency adaptive process; and wherein said clock noise mitigation using a frequency adaptive process is accomplished by:
a detector measuring the bit error rate (BER) of an incoming data stream;
a software control module controlling the frequency of a clock generator; and
said software incrementing the frequency of the clock generator, wherein said detector BER will change lower as the frequency of the clock generator until it moves the interfering signal out of the communication channel.

2. The apparatus of claim 1, wherein said oscillator is a voltage controlled oscillator (VCO) operating near a desired frequency used to generate an output signal.

3. The apparatus of claim 1, wherein M and N dividers are set to enable the frequency increments to be as small as desired.

4. The apparatus of claim 3, wherein said M and N dividers are dynamically programmable.

5. The apparatus of claim 1, wherein depending on the communication channels being used, the frequency of said clock is modified either up or down to avoid interference.

6. The apparatus of claim 1, wherein when no further improvement in BER is detected, the frequency decrementing or incrementing will cease.

7. The apparatus of claim 1, further comprising a control loop that keeps said BER minimized.

8. The apparatus of claim 1, wherein said clock noise mitigation using a frequency adaptive process is facilitated by a software link between said apparatus and said oscillator that is capable of knowing the channel being used and comparing it with known clock signals being produced and thereby determining the appropriate frequency of said clock.

9. The method of claim 1, further comprising modifying either up or down, depending on the communication channels being used, the frequency of said clock to avoid interference.

10. A method of mitigating clock noise, comprising:
using a frequency adaptive process to modify a clock signal either up or down depending on the communication channels being used to avoid interference; and
measuring the bit error rate (BER) of an incoming data stream, controlling the freguency of a clock generator by a software control module, and incrementing the freguency of the clock generator such that said BER will change lower as the freguency of the clock generator is modified until it moves the interfering signal out of the communication channel.

11. The method of claim 10, wherein said clock signal is generated by a voltage controlled oscillator (VCO) operating near a desired frequency used to generate an output signal.

12. The method of claim 11, further comprising accomplishing said clock noise mitigation by feeding a portion of said VCO signal into a first dividing circuit capable of dividing by a given number M, and a second dividing circuit, N, wherein said first and second dividing circuits are capable of producing a signal close to the frequency of a reference oscillator, and comparing said VCO signal via a phase comparator to a reference frequency and feeding back the phase comparator signal to said VCO such that its frequency will lock to said reference oscillator.

13. The method of claim 12, further comprising setting said M and N dividers to enable the frequency increments to be as small as desired.

14. The method of claim 12, wherein said M and N dividers are dynamically programmable.

15. The method of claim 10, further comprising ceasing said frequency decrementing or incrementing when no further improvement in BER is detected.

16. The method of claim 10, further comprising utilizing a control loop that keeps said BER minimized.

17. The method of claim 10, further comprising facilitating said clock noise mitigation using a frequency adaptive process by a software link between said apparatus and said oscillator that is capable of knowing the channel being used and comparing it with known clock signals being produced and thereby determining the appropriate frequency of said clock.

18. An article, comprising:
a storage medium having stored thereon instructions, that, when executed by a computing platform results in mitigating clock noise by using a frequency adaptive process to modify a clock signal either up or down depending on the communication channels being used to avoid interference; and wherein said clock noise mitigation using a frequency adaptive process is accomplished by:
a detector measuring the bit error rate (BER) of an incoming data stream;

a software control module controlling the frequency of a clock generator; and said software incrementing the frequency of the clock generator, wherein said detector BER will change lower as the frequency of the clock generator until it moves the interfering signal out of the communication channel.

19. The article of claim 18, wherein said instructions control a clock signal that is generated by a voltage controlled oscillator (VCO) operating near a desired frequency used to generate an output signal.

20. The article of claim 19, further comprising accomplishing said clock noise mitigation by feeding a portion of said VCO signal into a first dividing circuit capable of dividing by a given number M, and a second dividing circuit, N, wherein said first and second dividing circuits are capable of producing a signal close to the frequency of a reference oscillator, and comparing said VCO signal via a phase comparator to a reference frequency and feeding back the phase comparator signal to said VCO such that its frequency will "lock" to said reference oscillator.

21. The article of claim 19, further comprising setting said M and N dividers to enable the frequency increments to be as small as desired.

22. A wireless communication system, comprising:
a wireless device capable of communicating within said wireless communication system with other wireless devices, said wireless device comprising an oscillator capable of generating a clock signal, wherein said apparatus is capable of clock noise mitigation using a frequency adaptive process; and wherein said clock noise mitigation using a frequency adaptive process is accomplished by:

a detector measuring the bit error rate (BER) of an incoming data stream;

a software control module controlling the frequency of a clock generator; and said software incrementing the frequency of the clock generator, wherein said detector BER will change lower as the frequency of the clock generator until it moves the interfering signal out of the communication channel.

23. The system of claim 22, wherein said oscillator is a voltage controlled oscillator (VCO) operating near a desired frequency used to generate an output signal.

24. The system of claim 22, wherein said clock noise mitigation is accomplished by portion of said VCO signal being fed into a first dividing circuit capable of dividing by a given number M, and a second dividing circuit, N, wherein said first and second dividing circuits are capable of producing a signal close to the frequency of a reference oscillator, said VCO signal is compared via a phase comparator to a reference frequency and wherein the phase comparator signal is then fed back to the VCO such that its frequency will "lock+ to said reference oscillator.

25. The system of claim 22, wherein M and N dividers are set to enable the frequency increments to be as small as desired.

* * * * *